United States Patent [19]

Shimada

[11] Patent Number: 4,908,718
[45] Date of Patent: Mar. 13, 1990

[54] IMAGE READING APPARATUS HAVING A LIGHT SHIELDING LAYER ARRANGED ON THE SIDES OF THE SUBSTRATE AND PROTECTIVE LAYERS OF A PHOTO SENSOR

[75] Inventor: Tetsuya Shimada, Zama, Japan

[73] Assignee: Canon Kabushiki Kaisha, Tokyo, Japan

[21] Appl. No.: 213,848

[22] Filed: Jun. 30, 1988

[30] Foreign Application Priority Data

Jul. 9, 1987 [JP] Japan .................. 62-172008

[51] Int. Cl.$^4$ ............................................ H04N 1/024
[52] U.S. Cl. ................... 358/494; 358/471; 358/482; 358/483; 358/213.11; 250/208.1; 357/30
[58] Field of Search ............ 358/473, 482, 483, 472, 358/293, 494, 294, 471, 213.11, 213.13; 250/578

[56] References Cited

U.S. PATENT DOCUMENTS

| | | | |
|---|---|---|---|
| 4,189,753 | 2/1980 | Parsons et al. | 358/294 |
| 4,305,100 | 12/1981 | Hattori | 358/294 |
| 4,395,629 | 7/1983 | Sasano et al. | 250/578 |
| 4,455,577 | 6/1984 | Tokahara | 358/294 |
| 4,689,652 | 8/1987 | Shimada et al. | 358/213.13 |
| 4,768,096 | 8/1988 | Cannella et al. | 358/473 |
| 4,775,895 | 10/1988 | Traupe et al. | 358/494 |
| 4,792,859 | 12/1988 | Wicker et al. | 358/473 |
| 4,803,375 | 2/1989 | Saito et al. | 250/578 |
| 4,839,730 | 6/1989 | Shirakoshi et al. | 358/213.11 |

FOREIGN PATENT DOCUMENTS 0190455 11/1982 Japan .
0062267 4/1984 Japan .
0020675 2/1985 Japan .
0091759 5/1985 Japan .

Primary Examiner—James J. Groody
Assistant Examiner—Kim Yen Vu
Attorney, Agent, or Firm—Fitzpatrick, Cella, Harper & Scinto

[57] ABSTRACT

A photosensor for an image reading apparatus includes a light-transmissive substrate, a light shielding layer arranged on a portion of the surface of the substrate, and a photosensor formed over the light shielding layer. Protective layers are arranged on the surface of the photosensor. Light shielding structure is provided on the sides of the substrate and/or the sides of the protective layers to prevent stray light from entering the side of the photosensor.

37 Claims, 4 Drawing Sheets

IMAGE READING APPARATUS HAVING A LIGHT SHIELDING LAYER ARRANGED ON THE SIDES OF THE SUBSTRATE AND PROTECTIVE LAYERS OF A PHOTO SENSOR

BACKGROUND OF THE INVENTION

1. Field of the Invention

The present invention relates to an image reading apparatus and, more particularly, to an image reading apparatus suitable for use in, for example, a facsimile apparatus, image reader, or the like which has a one-dimensional line sensor and reads image information from an original to be read while relatively moving the original in contact with this line sensor.

2. Related Background Art

Hitherto, as an image reading apparatus using a one-dimensional line sensor, there has been known an apparatus in which an image of an original is formed onto a one-dimensional sensor having a length of a few centimeters by using a reduction optical system, thereby reading image information. However, such an image reading apparatus needs a long optical path to reduce an image or to form an image and the volume of the optical system is large, so that it is difficult to miniaturize the reading apparatus.

On the other hand, in the case of using an equal-magnification optical system using a long one-dimensional line sensor of the same length as the width of the original, the volume of the optical system can be fairly reduced and the reading apparatus can be miniaturized. As a method of realizing such an equal-magnification optical system, there has been known a method whereby a convergent fiber is used, a method whereby a contact lens array is used, or the like.

However, since convergent fiber is generally expensive, the assignee of the present invention has already proposed contact type original reading methods of reading image information while moving an original in contact with a one-dimensional line sensor without using a fiber or lens array (Japanese Patent Applications Laid-Open Nos. 55-74262, 55-75271, 56-45084, 56-122172)

FIG. 1 is a side cross sectional view with a part cut away showing the main section of the foregoing contact type image reading apparatus. An outline of this apparatus will be described. Reference numeral 8 denotes a photo sensor. The photo sensor 8 is arranged on a transparent substrate made of glass or the like in the direction perpendicular to the drawing and constitutes a one-dimensional line sensor.

In the photo sensor 8, a light shielding layer 12 made of metal or the like and an insulative layer 13 are formed on the transparent substrate such as a glass. A semiconductor layer 14 made of amorphous silicon hydride (hereinafter abbreviated to A-Si:H), CdS.Se, or the like serving as a photoconductive layer is formed on the insulative layer 13. Further, a pair of main electrodes 16 and 17 are formed through a doping semiconductor layer 15 for ohmic contact. A light receiving window 18 is formed between the main electrodes 16 and 17.

In such a structure, a light L enters through an incident window 19 of the transparent substrate 11 (the photo sensor 8 is shielded against this incident light by the light shielding layer 12). An original P is illuminated by the incident light L. The reflected light is received by the photo sensor 8 and converted into an electric signal. This signal is taken out of the photo sensor 8 through electrode wiring (not shown) Namely, for example, assuming that a potential of the main electrode 16 is a reference potential and a drive voltage of a high potential is applied to the main electrode 17, when the reflected light L enters the surface of the semiconductor layer 14 through the light receiving window 18, the charges increase. Thus, the resistance decreases and this resistance change can be read as image information.

In this structure, the light from a light source 30 enters from the back side of the substrate 11. At this time, if the direct light from the light source 30 enters the photo sensor 8 in addition to the reflected light from the original surface, a photo current by the direct light flows as a stationary current. Thus, even if a photo current due to the reflected light from the original surface flows, the S/N ratio fairly deteriorates. Therefore, to prevent the direct light from the light source 30 entering the photo sensor 8, the light shielding layer 12 must be provided on the light source side of the photo sensor 8. The light shielding layer 12 is ordinarily made of metal in order to assure a high light shielding property with a thin film.

On the other hand, when an interval between the original P and the photo sensor 8 is generally set to about 0.1 mm a reading resolution within a range from 4 lines/mm to 8 lines/mm is obtained. However, to quarantee such a resolution, this interval must be accurately controlled. Such a control of the interval is accomplished by coating a transparent protective layer 20 onto the upper surface of the photo sensor 8.

However, in such a conventional construction, there is a case where stray lights L' other than the light to illuminate the original enter from the sides of the sensor substrate or from the surface of the protective layer and are scattered in the transparent substrate and protective layer and irradiate the photo sensor. When a photo current is generated by the stray lights, even if a photo current caused by the reflected light from the original surface flows, the S/N ratio is deteriorated by the stray lights. Further, even in cases other than image reading for instance, even when the light source is off, the stray lights always illuminate the photo sensor, so that the photo sensor is deteriorated by the stray lights.

SUMMARY OF THE INVENTION

It is an object of the present invention to improve the foregoing conventional image reading apparatus.

Another object of the invention is to provide an image reading apparatus which can prevent the stray lights from entering the sides of a sensor substrate or from the surface and sides of a protective layer, or the like and can further improve the S/N ratio and can reduce the deterioration of a photo sensor caused by the light, as compared with the conventional apparatus.

Still another object of the invention is to provide an image reading apparatus comprising: a light shielding layer arranged on the surface of a substrate which can transmit light; an insulative layer arranged on the light shielding layer; a photo sensor arranged on the insulative layer; and protective layers arranged on the photo sensor, wherein the reflected light of the light irradiated onto the surface of an original from the back side of a substrate is received by the photo sensor, thereby reading image information, and light shielding means are provided to at least parts of the sides of the substrate and of the surface and sides of the protective layer.

Still another object of the invention is to provide an image reading apparatus comprising a light shielding layer arranged on the surface of a substrate which can transmit light, a photo sensor formed directly on or formed indirectly over the light shielding layer, and protective layers arranged on the photo sensor, wherein light shielding means are provided on the sides of the substrate and protective layers.

Still another object of the invention is to provide a reading apparatus comprising: an image reading apparatus having (a) a light shielding layer arranged on the surface of a substrate which can transmit light, (b) a photo sensor formed directly on or formed indirectly over the light shielding layer, (c) protective layers arranged on the photo sensor, and (d) light shielding means arranged on the sides of the substrate and/or the protective layers; moving means for relatively moving an original for the image reading apparatus in close vicinity to or in contact with the protective layers; and a light source to illuminate the original.

DETAILED DESCRIPTION OF THE PREFERRED EMBODIMENT

The present invention will be described in detail hereinbelow with reference to the drawings.

Figure 1:
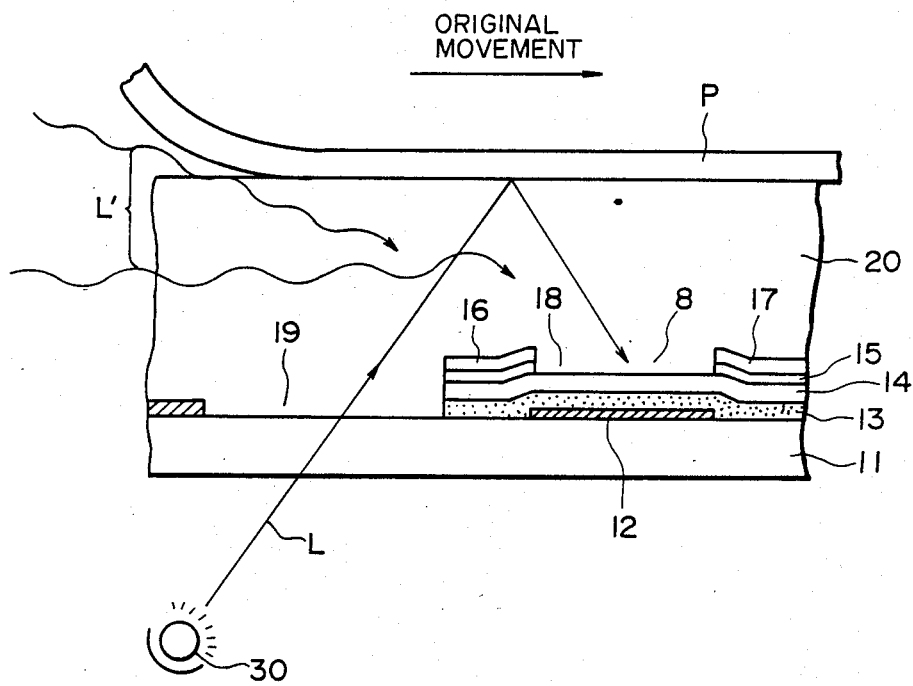
FIG. 1 is a schematic side cross sectional view showing an example of a conventional image reading apparatus.
Figure 2A:
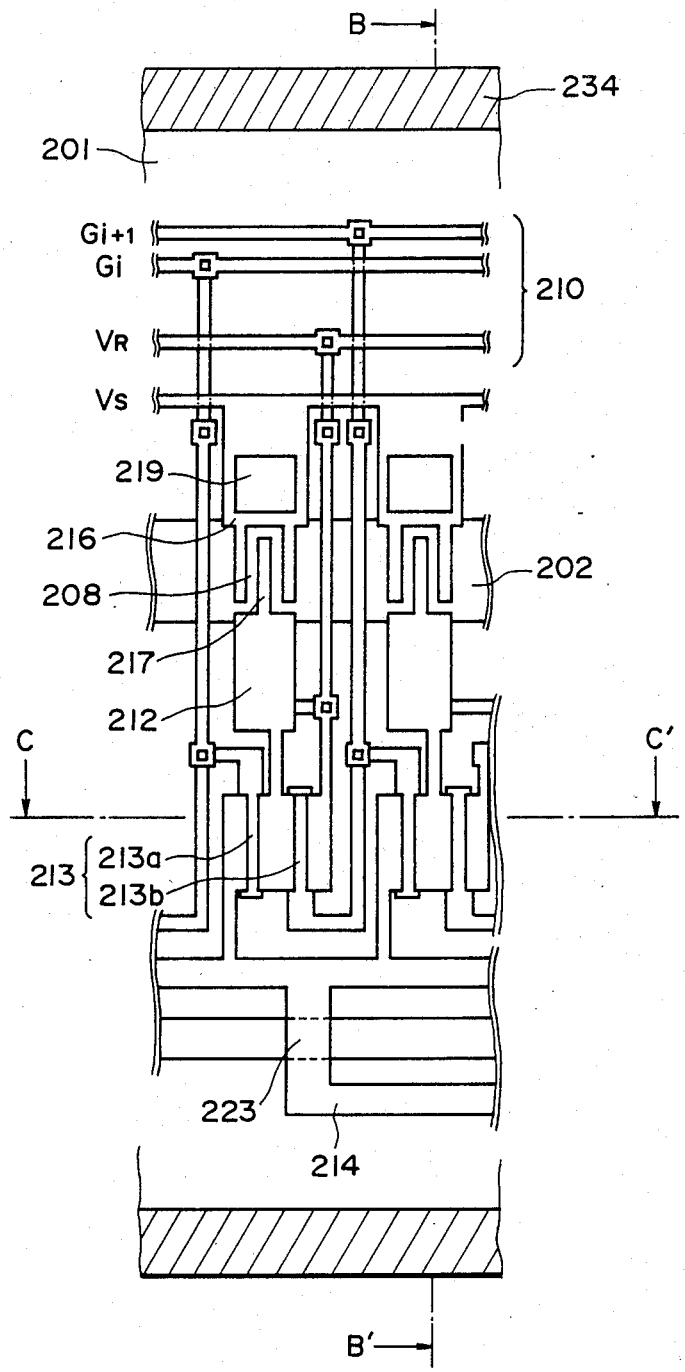
FIG. 2(A) is a schematic plan view of a line sensor according to one aspect of an embodiment of the invention.
Figure 2B:
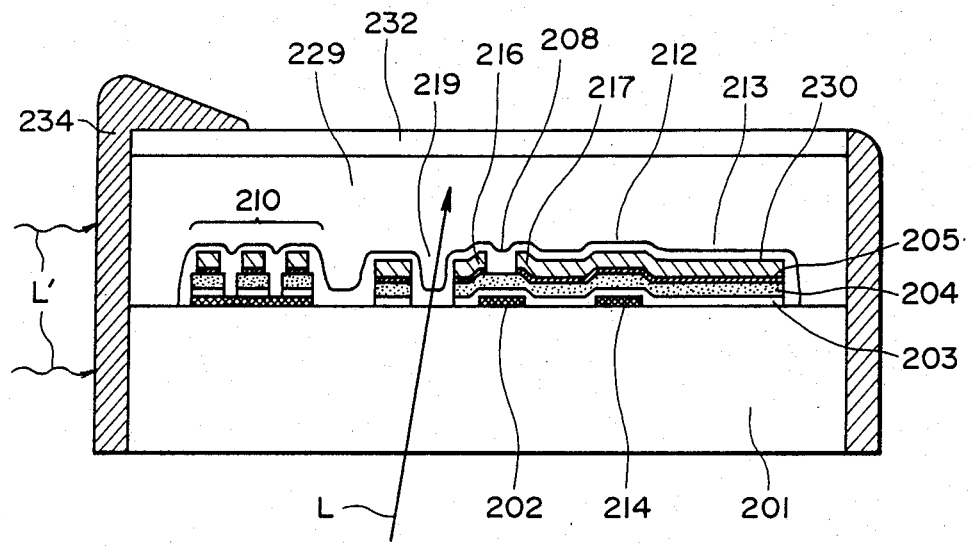
FIG. 2(B) is a schematic cross sectional view taken along the line B-B' in FIG. 2(A)
Figure 2C:
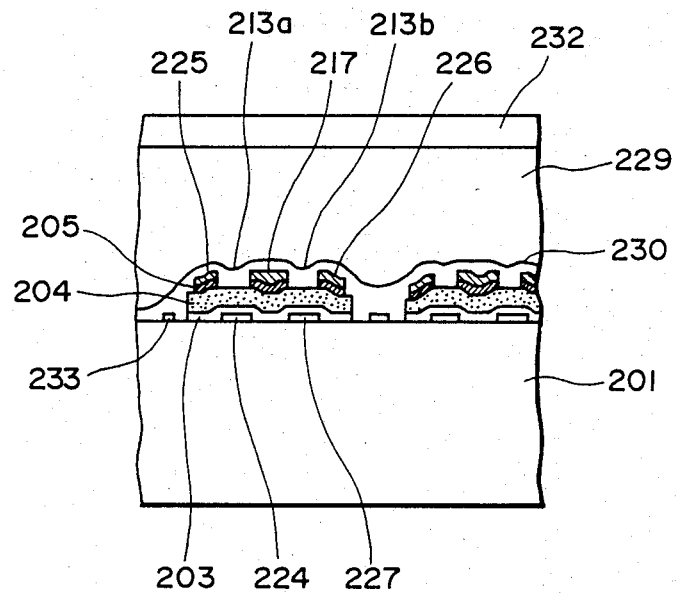
FIG. 2(C) is a schematic cross sectional view taken along the line C-C' in FIG. 2(A)

FIG. 2(A) is a schematic plan view of a line sensor according to one aspect of a preferred embodiment of the invention. FIGS. 2(B) and 2(C) are schematic cross sectional views taken along the lines B-B' and C-C' in FIG. 2(A).

In these diagrams, reference numeral 210 denotes a matrix wiring section; 208 indicates a photo sensor section; 212 is a charge accumulating section; 213 a switch section including a transfer switch 213a and a discharge switch 213b to reset charges in the charge accumulating section 213; 214 a wiring to connect a signal output of the transfer switch 213a with a signal processing section, which will be explained hereinafter; 223 a load capacitor to accumulate and read out the charges transferred by the transfer switch 213a; and 234 a light shielding member to shut out stray lights.

In this embodiment, an A-Si:H film is used as a photoconductive semiconductor layer 204 constituting the photo sensor section 208, transfer switch 213a; and discharge switch 213b. A silicon nitride (SiNH) film which is formed by glow discharge is used as an insulative layer 203.

In FIG. 2(A), to avoid complexity, the photoconductive semiconductor layer 204, insulative layer 203, and protective layers 229, 230, and 232 are not shown. The photoconductive semiconductor layer 204 and insulative layer 203 are formed not only in the photo sensor section 208, charge accumulating section 212, transfer switch 213a, and discharge switch 213b, but also between the upper layer electrode wiring and the substrate. Further, an A-Si:H layer 205 which is doped to n+ is formed on the interface between the upper electrode wiring and the photoconductive semiconductor layer, thereby obtaining the ohmic contact.

On the other hand, in the wiring pattern of the line sensor in the embodiment, all of the signal paths which are output from respective sensor sections are arranged so as not to cross the other wirings, thereby preventing the generation of crosstalk among signal components and the induction noise from the gate electrode wiring.

In the photo sensor section 208, reference numerals 216 and 217 denote upper electrode wirings. The light enters from an incident window 219 and is reflected by the surface of an original. This reflected light changes a conductivity of the photoconductive semiconductor layer 204 in the photo sensor section 208, thereby changing a current flowing between upper layer electrode wirings 216 and 217 which face each other like a comb. Reference numeral 202 denotes a light shielding layer made of, e.g., metal. The light shielding layer 202 is connected to a proper drive section and prevents direct light from the light source from entering the photo sensor section 208.

The charge accumulating section 212 comprises: the lower layer electrode wiring 214; a dielectric layer consisting of the insulative layer 203 and photoconductive semiconductor layer 204 which are formed on the lower layer electrode wiring 214; and a wiring which is formed on the photoconductive semiconductor layer 204 and continues with the upper layer electrode wiring 217 in the photo sensor section. The charge accumulating section 212 has the same structure as a so-called MIS (Metal Insulator Semiconductor) capacitor. Although either the positive or negative bias condition can be used, the stable capacitance and frequency characteristic can be obtained by always setting the lower layer electrode wiring 214 to a negative bias condition.

FIG. 2(C) shows the switch section of a TFT structure including the transfer switch 213a and discharge switch 213b. The transfer switch 213a comprises: a lower layer electrode wiring 224 serving as a gate electrode; the insulative layer 203 serving as a gate insulative layer; the photoconductive semiconductor layer 204; an upper layer electrode wiring 225 serving as a source electrode; the upper layer electrode wiring 217 serving as a drain electrode; and the like. The gate insulative layer and photoconductive semiconductor layer of the discharge switch 213b are the same layers as the insulative layer 203 and photoconductive semiconductor layer 204. The source electrode corresponds to the upper layer electrode wiring 217. The gate electrode corresponds to a lower layer electrode wiring 227. The drain electrode corresponds to an upper layer electrode wiring 226. A lower layer wiring 233 is connected to a gate electrode of the transfer switch 213a.

Further, as shown in FIGS. 2(B) and 2(C), the protective layers 229, 230, and 232 having a 3-layer structure are formed on the photo sensor section 208. Since the first protective layer 230 directly comes into contact with the photo sensor section 208 or the like, an inorganic thin film such as $SiO_2$ film or SiNH film is used as a material of high purity which can stabilize the surface of the photo sensor section 208 or the like. Or, an organic film such as polyimide resin is used as such a material since a film can be easily formed. An epoxy resin or the like having an excellent adhesive property is used as a material of the second protective layer 229 in order to improve moisture resistance. As a material having an abrasion resistance and a high light transmittivity, a thin plate glass such as borosilicate glass is used to form the third protective layer 232. In this case, the second protective layer 229 also functions as an adhesive agent. As explained above, the protective layers have a laminated structure in which a plurality of functions which cannot be satisfied by the same material are provided for the respective layers. In other words, the functions are separated, thereby assuring the environmental resistance property of the line sensor.

As described above, in the line sensor according to the embodiment, all of the composing sections of the photo sensor section, charge accumulating section, transfer switch, discharge switch, and matrix wiring section have a laminated structure consisting of the photoconductive semiconductor layer, insulative layer, protective layer, and the like. Therefore, those sections can be simultaneously formed by the same process.

Figure 3:
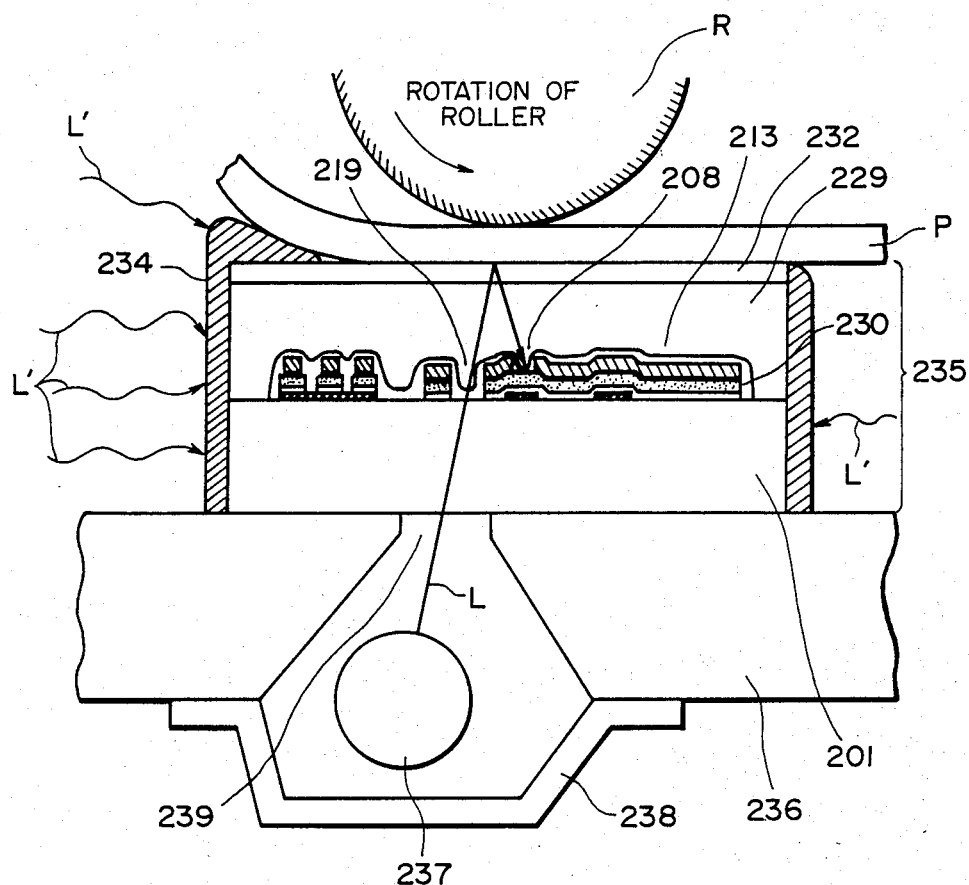
FIG. 3 is a schematic constitutional diagram of an image reading apparatus using the line sensor shown in FIGS. 2(A), 2(B), and 2(C).

FIG. 3 is a schematic constitutional cross sectional view showing one aspect of a preferred embodiment of an image reading apparatus using the foregoing line sensor. In explanation of the outline of this apparatus, reference numeral 208 denotes the photo sensor section which is arranged on the transparent substrate 201 in the direction perpendicular to the drawing and constructs a one-dimensional line sensor 235.

The line sensor 235 is made of a conductive material such as metal and put on a holding member 236 having a slit 239. When image information of the original P is read, the line sensor 235 comes into contact with the original P which is conveyed by a feed roller R. A light source 237 is arranged so as to face the line sensor 235 through the holding member 236. An LED which has conventionally been used can be used as the light source 237. On the other hand, it is preferable to use a discharge tube such as xenon glow lamp or the like in which, as compared with the LED, the quantity of light is larger, the variation in light quantity is smaller, the temperature characteristic is more stable, and the cost is lower. Reference numeral 238 denotes a lamp protective member made of a conductive material such as metal. In the case of using a discharge tube as a light source, the lamp protective member 238 is provided to mechanically protect light source 237 and to seal radiation noise which is generated from the light source 237. On the other hand, the light shielding member 234 prevents stray lights L' from entering the sides of the transparent substrate 201 and protective layers 229, 230, and 232 and from the surface of the protective layer 232.

In such a structure, the light L emitted from the discharge tube light source 237 passes through the slit 239 of the holding member 236 and through the incident window 219 on the transparent substrate 201 and illuminates an image on the original P to be read. The reflected light is received by the photo sensor section 208.

In general, when the stray lights other than the light to illuminate the original enter from the sides of the transparent substrate or from the sides and surface of an arbitrary protective layer and are reflected and scattered and illuminate not only the photo sensor section but also the capacitor section or switch section, the signal level is shifted or a malfunction is caused. Further, even in the cases other than the image reading time or even when the light source is lit off, if the stray lights always illuminate the photo sensor section or the like, the photo sensor section is deteriorated by the stray lights, so that the reliability of the photo sensor over a period of time will decay.

Therefore, as shown in the embodiment of FIGS. 2(A), 2(B), and 3, in this invention, the light shielding members 234 are provided on the sides of the transparent substrate 201 and protective layers 229, 230, and 232 and on the surface of the protective layer 232. Due to this structure, it is possible to realize an image reading apparatus in which the foregoing problems can be solved, a good S/N ratio is obtained deterioration caused by stray light is reduced, and the apparatus can be used for a long time.

As material of the light shielding members 234, any material can be used if it can prevent transmission of stray light, and can be adhesively secured to the substrate 201, protective layers 229, 230, and 232, holding member 236, and the like. However, a substantially non-light transmitting organic resin or paint or the like is used in consideration of the easiness with which it forms the light shielding member and its low cost. It is desirable that the color of such resin or paint be a dark color such as black, deep blue, dark green, or the like.

The invention is not limited to only the structure of the embodiment but can also use a structure such as to shut out the stray lights other than the light which illuminates the original by providing the light shielding means to at least parts of the sides of the photo sensor substrate or to parts of the sides and surface of the protective layers.

Further, as mentioned above, when constructing the protective layers of a laminated structure in which a plurality of functions are provided for the respective layers, at least one of the functions of the protective layers is added to the light shielding member and it is packaged so as to surround the substrate and protective layers. Due to this, a degree of freedom in selection of the material of the protective layer is increased and the stability of the image reading apparatus in the environment is further improved.

As described above, according to the invention, there is provided an image reading apparatus comprising: a light shielding layer arranged on a substrate which can transmit light; an insulative layer formed on the light shielding layer; a photo sensor formed directly on or formed indirectly over the insulative layer; and protective layers arranged on and over the photo sensor, wherein the reflected light of the light irradiated onto the surface of an original from the back side of the substrate is received by the photo sensor, thereby reading image information. In this apparatus, by providing light shielding means on at least portions of the sides of the substrate or of the surface and sides of the protective layers, stray lights other than the light to which illuminates the original are prevented from entering the sides of the substrate and protective layers and enter the photo sensor section and, further, the switch section. Thus, an image reading apparatus having a good S/N ratio is derived and the deterioration of the photo sensor caused by the light is reduced, and an apparatus with long life is realized.

Moreover, as a material of the light shielding means, the material having at least one of the functions of the protective layers is selected and formed on the sides of the substrate. Consequently, a degree of freedom in selection of the material constituting the protective layers increases and, at the same time, an image reading apparatus with improved environmental stability is obtained.

What is claimed is:

1. A photo sensor for an image reading apparatus, comprising:
    a light-transmissive substrate;
    a light shielding layer arranged on a portion of a surface of said substrate;
    an insulative layer arranged on said light shielding layer;
    a photoconductive semiconductor layer arranged on said insulative layer;
    protective layers arranged on said photoconductive semiconductor layer, wherein light irradiated through a back side of the substrate is reflected from an original and received by said photoconductive semiconductor layer, thereby reading image information; and
    light shielding means provided on the sides of the substrate and on the sides of the protective layers.

2. A photo sensor according to claim 1, wherein said light shielding means comprises a substantially non-light transmitting organic resin.

3. A photo sensor according to claim 1, wherein said light shielding means comprises a substantially non-light transmitting paint.

4. A photo sensor according to claim 2, wherein a color of said organic resin is a dark color 5. A photo sensor according to claim 3, wherein a color of said paint is a dark color.

6. A photosensor according to claim 1, wherein said photoconductive semiconductor layer comprises an amorphous silicon.

7. A photosensor according to claim 1 wherein said protective layers are selected from a group consisting of an inorganic thin film and an organic film.

8. A photosensor according to claim 7, wherein said inorganic thin film comprises one of $SiO_2$ and SiNH.

9. A photosensor according to claim 8, wherein said organic film comprises one of a polyimide resin and an epoxy resin.

10. A photo sensor for an image reading apparatus, comprising:
    a light-transmissive substrate;
    a light shielding layer arranged on a surface of said substrate;
    a photo sensor formed over said light shielding layer;
    protective layers arranged on said photo sensor; and
    light shielding means provided on the sides of said substrate and the sides of said protective layers.

11. A photo sensor according to claim 10, wherein said light shielding means comprises a substantially non-light transmitting organic resin.

12. A photo sensor according to claim 10, wherein said light shielding means comprises a substantially non-light transmitting paint.

13. A photo sensor according to claim 11, wherein a color of said organic resin is a dark color.

14. A photo sensor according to claim 12, wherein a color of said paint is a dark color.

15. A photo sensor according to claim 10, wherein said light shielding means is provided on at least parts of the surfaces of said protective layers.

16. A photosensor according to claim 10, wherein said photosensor has a photoconductive semiconductor layer.

17. A photo sensor according to claim 10, wherein said photoconductive semiconductor layer comprises an amorphous silicon.

18. A photosensor according to claim 10, wherein said protective layers are selected from a group consisting of inorganic thin film and an organic film.

19. A photosensor according to claim 18, wherein said inorganic thin film comprises one of $SiO_2$ and SiNH.

20. A photosensor according to claim 18, wherein said organic film comprises one of a polyimide resin and an epoxy resin.

21. A reading apparatus comprising:
    an image reading apparatus having a light transmissive substrate, (b) a light shielding layer arranged on a surface of said substrate, (c) a photo sensor formed over said light shielding layer, (d) protective layers arranged on said photo sensor, and (e) light shielding means provided on the sides of said substrate and/or said protective layers;
    moving means for relatively moving an original with respect to said reading apparatus such that the original is proximate to or in contact with said protective layers; and
    a light source to illuminate the original.

22. A reading apparatus according to claim 21, wherein said light shielding means comprises a substantially non-light transmitting organic resin and/or paint.

23. A reading apparatus according to claim 22, wherein a color of said light shielding means is a dark color.

24. A reading apparatus according to claim 21, wherein said light source comprises an LED.

25. A reading apparatus according to claim 21, wherein said light source comprises a discharge tube.

26. A reading apparatus according to claim 25, wherein said discharge tube comprises a xenon glow lamp.

27. A reading apparatus according to claim 21, further comprising a lamp protective member covering said light source.

28. A reading apparatus according to claim 27, wherein said light source comprises a discharge tube.

29. A reading apparatus claim 27, wherein said light source comprises a discharge tube, and wherein said lamp protective member includes a conductive material.

30. A reading apparatus according to claim 29, wherein said lamp protective member comprises metal.

31. A reading apparatus according to claim 27, wherein said lamp protective member is coupled to a holding member which holds the image reading apparatus and has a slit to pass light.

32. A reading apparatus according to claim 21, wherein said light shielding means are further formed on the surfaces of the protective layers.

33. A photosensor according to claim 21, wherein said photosensor has a photoconductive semiconductor layer.

34. A photosensor according to claim 33, wherein said photoconductive semiconductor layer comprises an amorphous silicon.

35. A photosensor according to claim 21, wherein said protective layers are selected from a group consisting of an inorganic thin film and an organic film.

36. A photosensor according to claim 35, wherein said inorganic thin film is one of $SiO_2$ and SiNH.

37. A photosensor according to claim 35, wherein said organic film comprises one of a polyimide resin and an epoxy resin.

* * * * *

UNITED STATES PATENT AND TRADEMARK OFFICE
CERTIFICATE OF CORRECTION

PATENT NO. : 4,908,718  Page 1 of 2
DATED : March 13, 1990
INVENTOR(S) : Tetsuya Shimada It is certified that error appears in the above-identified patent and that said Letters Patent is hereby corrected as shown below:

COLUMN 1:

Line 43, "56-122172)" should read --56-122172).--.

Line 54, "substrate" should read --substrate 11--.

COLUMN 2:

Line 1, "(not shown)" should read --(not shown).--

Line 18, "entering" should read --from entering--.

COLUMN 5:

Line 46, "protect" should read --protect the--.

COLUMN 6:

Line 53, "to" should be deleted.

UNITED STATES PATENT AND TRADEMARK OFFICE
CERTIFICATE OF CORRECTION

PATENT NO. : 4,908,718          Page 2 of 2

DATED : March 13, 1990

INVENTOR(S) : Tetsuya Shimada

It is certified that error appears in the above-identified patent and that said Letters Patent is hereby corrected as shown below:

COLUMN 7:

Line 26, "color" should read --color.--.

Line 32, "claim 1" should read --claim 1,--.

Line 37, "claim 8," should read --claim 7,--.

Line 66, "claim 10," should read --claim 16,--.

COLUMN 8:

Line 11, "having a" should read --having (a) a--.

Signed and Sealed this

Fourth Day of June, 1991

*Attest:*

HARRY F. MANBECK, JR.

*Attesting Officer*      *Commissioner of Patents and Trademarks*